United States Patent [19]

Kobayashi et al.

[11] 3,944,995
[45] Mar. 16, 1976

[54] DEVICE FOR DETECTING SHORT-CIRCUIT BETWEEN ELECTRODES IN ELECTROLYTIC CELL

[75] Inventors: Takeshi Kobayashi; Yoshiharu Tanaka, both of Tamano, Japan

[73] Assignee: Mitsui Mining & Smelting Co., Ltd., Tokyo, Japan

[22] Filed: May 20, 1975

[21] Appl. No.: 579,070

[52] U.S. Cl. ............... 340/253 A; 324/29; 324/51
[51] Int. Cl.² ............................................ G08B 21/00
[58] Field of Search ...... 340/248, 253, 249; 324/29, 324/29.5, 51, 43; 204/1 R, 242

[56] References Cited
UNITED STATES PATENTS

| | | | |
|---|---|---|---|
| 3,175,150 | 3/1965 | Druylants | 324/29 |
| 3,559,199 | 1/1971 | Schäfer | 340/253 A |
| 3,609,525 | 9/1971 | Clingenpeel et al. | 324/29.5 |
| 3,713,020 | 1/1973 | Kohler | 324/51 |
| 3,792,457 | 2/1974 | Templeton et al. | 340/253 A |
| 3,818,325 | 6/1974 | Boshers | 324/29.5 |

Primary Examiner—John W. Caldwell
Assistant Examiner—Daniel Myer
Attorney, Agent, or Firm—Armstrong, Nikaido & Wegner

[57] ABSTRACT

A device for detecting short-circuit between electrodes in electrolytic cells constituting an electrolytic plant in which a plurality of switch elements turned on and off under control of an external magnetic field are disposed to be vertically movable toward and away from the current collecting end portions of the individual anodes or cathodes in the electrolytic cells. These switch elements are moved downward to detect occurrence of short-circuit between the electrodes in one of the electrolytic cells, and when no short-circuit is detected in this electrolytic cells, the switch elements are automatically conveyed to the detecting position on the next electrolytic cell.

11 Claims, 4 Drawing Figures

DEVICE FOR DETECTING SHORT-CIRCUIT BETWEEN ELECTRODES IN ELECTROLYTIC CELL

This invention relates to a device for detecting short-circuit between electrodes in electrolytic cells used for the electrowinning or electrorefining of metals.

In the electrowinning or electrorefining of a metal, insoluble or soluble electrodes of suitable materials are used as cathodes and anodes to be placed in a cell holding an electrolyte which is an aqueous solution of a salt of the metal, and electrolysis is carried out in the cell so as to obtain a product in the form of the refined metal or an oxide of the metal. In such an electrowinning or electrorefining process, improvements in the current efficiency are urgently required since a great amount of electric power is consumed in the electrolysis. In the electrowinning or electrorefining process, however, undesirable short-circuit between the electrodes tends to occur when a bend, deformation or modules exists on the electrodes or when the electrodes are displaced from the adjusted position in the cell. Even when the causes giving rise to the trouble above described are eliminated, short-circuit between the electrodes would still occur when the metal or metal oxide is deposited on the cathodes or anodes to such an extent that it makes shorting contact with the opposite electrodes. Such a short-circuit phenomenon is objectionable in that not only the current efficiency is extremely reduced but also various troubles such as burning or dissolving of the electrodes and degradation of the properties of the deposited product are inevitable. It is therefore a matter of great importance to detect this objectionable short-circuit between the electrodes in the electrolytic cell.

In a prior art method commonly employed for detecting short-circuit of the kind above described, an operator carrying an ammeter in his hand checks mannually these electrodes one by one for detecting the state of current distribution. However, such manner of manual detection is defective in that it requires a great length of time for attaining the required measurement on all the electrodes, and the operator may fail to make the required check on some of the electrodes. Another method is also commonly employed in which an ammeter is provided for each of the anodes or cathodes in the electrolytic cell, and the current value indicated on each of these ammeters is checked to detect the state of current distribution. However, such detecting method is also defective in that, when applied to a large-scale metal electrowinning or electrorefining plant, measurement of current is quite troublesome and requires many operators.

It is therefore a primary object of the present invention to provide a novel and improved device for detecting short-circuit between electrodes in an electrolytic cell, which is simple in construction and can easily visually indicate the position of shorted electrodes. The present invention utilizes a commonly known fact that, when short-circuit occurs between adjacent electrodes in an electrolytic cell due to deformation of one of the electrodes in the electrolytic cell, nodule of a metal deposited product from the surface of one of the electrodes, or any other causes, the current value at the shorted electrodes becomes extremely large compared with that at the electrodes in normal state.

In accordance with the present invention, there is provided a device for detecting short-circuit occurring between anodes and cathodes in electrolytic cells constituting electrolytic plant, comprising a plurality of switch elements turned on and off under control of an external magnetic field, display means responsive to the operation of said switch elements, means for supporting said switch elements at a position above the current collecting end portions of the individual anodes or cathodes in one of said electrolytic cells, and means for carrying said switch element supporting means for vertical movement and capable of making travelling movement over said electrolytic cells from the position associated with one of said electrolytic cells to the position associated with the adjacent one, the travelling movement of said carrying means being controlled so that said switch elements can be accurately brought to the position adjacent to the current collecting end portions of the associated anodes or cathodes in each said electrolytic cell.

In a preferred form of the present invention, vertical movement control means is provided for controlling the upward movement of said switch element supporting means during the travelling movement of said carrying means and for controlling the downward movement of said switch element supporting means when said carrying means ceases the travelling movement, thereof and is held stationary.

Other objects, features and advantages of the present invention will become apparent from the following detailed description of a preferred embodiment thereof taken in conjunction with the accompanying drawing, in which.

Figure 1:
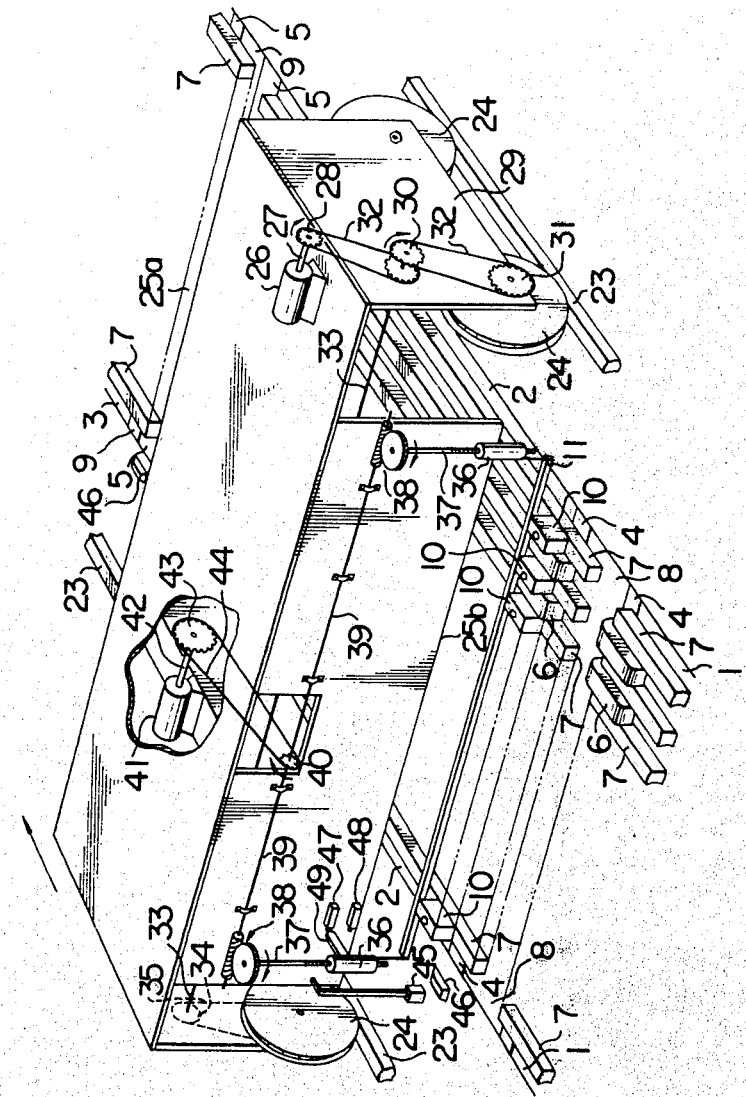
FIG. 1 is a schematic perspective view of an embodiment of the short-circuit detecting device according to the present invention.

A preferred embodiment of the device according to the present invention will now be described with reference to the accompanying drawing. Referring to FIG. 1 showing the general arrangement of parts of the device of the present invention, a plurality of electrolytic cells 1, 2 and 3 of Walker connection are partitioned from each other by partitions 4 and 5. It will be seen in FIG. 1 that a plurality of anodes 6 and cathodes 7 are alternately arranged in the electrolytic cells 1, 2 and 3 with the upper portions thereof locked in position by the partitions 4 and 5. The partition 4 partitioning the electrolytic cell 1 from the electrolytic cell 2 supports thereon a bus bar 8 which connects electrically one end of the anodes 6 in the electrolytic cell 1 to one end of the cathodes 7 in the electrolytic cell 2. The partition 5 partitioning the electrolytic cell 2 from the electrolytic cell 3 supports thereon another bus bar 9 which connects electrically one end of the anodes 6 in the electrolytic cell 2 to one end of the cathodes 7 in the electrolytic cell 3.

Figure 2:
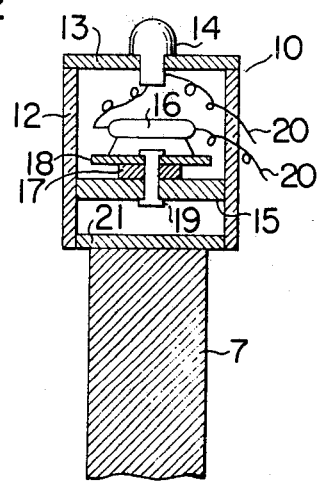
FIG. 2 is a longitudinal sectional view showing the detailed structure of a short-circuit detector employed in the present invention.

A plurality of short-circuit detectors 10 are supported by a horizontally extending supporter 11 so as to be come in contact with the respective anodes 6 or cathodes 7 in anyone of the electrolytic cells 1, 2 and 3. These short-circuit detectors 10 have a structure as shown in detail in FIG. 2. Referring to FIG. 2, each short-circuit detector 10 comprises a holding member or casing 12 consisting of an upper plate 13, a middle plate 15 and a lower plate 21 connected by side plates, a display lamp 14 mounted on the upper plate 13 of the casing 12, a reed switch 16 supported on a plate 18, and a permanent magnet 17 supported on the middle plate 15 of the casing 12. An adjusting rod 19 extends through the plate 15, permanent magnet 17 and plate 18 so as to adjust the position of the reed switch 16 relative to the position of the permanent magnet 17. The display lamp 14 and reed switch 16 are connected to a power source (not shown) by leads 20. The lower plate 21 of the casing 12 is adapted to come in contact with the top surface of the associated anode 6 or cathode 7.

It is commonly known that, when short-circuit occurs between one of the anodes 6 and the opposite cathode 7 due to the presence of a bend, deformation or metal module deposit on the anode 6 or cathode 7, the current value at this shorting portion becomes extremely large compared with that at the other normal anodes 6 and cathodes 7. Therefore, the reed switch 16 is previously designed in such a manner that the reed switch 16 is kept in the open position by the magnetomotive force generated by the current of normal value flowing in the normal state of the anode 6 and cathode 7, while the reed switch 16 is urged to the closed position by the magnetomotive force generated by the current of unusually large value appearing due to short-circuit. The normal current value or current setting is determined depending on various factors including the shape of the anode 6 or cathode 7, the distance between the reed switch 16 and the anode 6 or cathode 7, the degree of electromagnetic shielding between the reed switch 16 and the anode 6 or cathode 7, and the angular position of the reed switch 16 relative to that of the anode 6 or cathode 7. In the embodiment presently described, the reed switch energizing current value is adjusted by suitably turning the adjusting rod 19 for varying the angular relation between the reed switch 16 and the anode 6 or cathode 7 and varying the angular position of the reed switch 16 relative to that of the permanent magnet 17 which imparts to the reed switch 16 the magnetomotive force in a direction opposite to the direction of the magnetomotive force generated by the current.

Referring FIG. 1 again, means for causing horizontal travelling movement and vertical or lifting and lowering movement of these short-circuit detectors 10 will be described. A pair of guide rails 23 are disposed on opposite sides of the row of the electrolytic cells 1, 2 and 3 so as to extend in parallel with the extending direction of the anodes 6 and cathodes 7 in the electrolytic cells 1, 2 and 3. The means for causing the horizontal travelling movement and lifting and lowering movement of the short-circuit detectors 10 are mounted on a carriage 25 which bridges across the row of the electrolytic cells 1 to 3 and is provided with wheels 24 in rolling engagement with the guide rails 23. The carriage 25 has a top wall 25a, a front wall 25b and a pair of side walls 29. The means for causing the horizontal travelling movement of the short-circuit detectors 10 comprises a drive motor 26 mounted on the top wall 25a of the carriage 25, a driving wheel 28 mounted on one end of the motor shaft 27, an intermediate wheel 30 and a driven wheel 31 disposed on one of the side walls 29 of the carriage 25, and power transmission chains 32 trained around the wheels 28, 30 and 30, 31. The intermediate wheel 30 is mounted on one end of a shaft 33 extending horizontally through the side walls 29 of the carriage 25, and the driven wheel 31 is connected to one of the rail-engaging wheels 24 to drive the same. The shaft 33 mounting the intermediate wheel 30 on one end thereof and extending through the other side wall 29 of the carriage 25 mounts another intermediate wheel 34 on the other end thereof, and one of the rail-engaging wheels 24 on that side is driven by a chain 35 trained around the intermediate wheel 34 and another driven wheel (not shown).

The means for causing the lifting and lowering movement of the detectors 10 comprises a pair of internally threaded cylindrical members 36 mounted on the opposite ends of the supporter 11, a pair of threaded rods 37 in threaded engagement with the respective internally threaded cylindrical members 36, a pair of worm gears 38 in meshing engagement with gears mounted at the upper end of the respective threaded rods 37, a drive shaft 39 driving these two worm gears 38, a driven wheel 40 mounted on this drive shaft 39, a lifting and lowering motor 41 mounted beneath the top wall 25a of the carriage 25, a driving wheel 43 mounted on the motor shaft 42, and a power transmission chain 44 trained around the wheels 40 and 43.

A position detector 45 such as a proximity switch is fixed to the front wall 25b of the carriage 25 to control the travelling movement of the carriage 25 over the electrolytic cells 1 to 3. A plurality of detected elements 46 are disposed beneath the moving path of the position detector 45 so that the carriage 25 can be stopped at a suitable position at which the short-circuit detectors 10 can come in contact with the cathodes 7 in the vicinity of the bus bar 8 or 9 in one of the electrolytic cells. Thus, when the position detector 45 moving with the carriage 25 is brought to the position opposite to one of the detected elements 46, the position detector 45 acts to stop the travelling movement of the carriage 25 by stopping the rotation of the carriage drive motor 26.

A pair of position detectors 47 and 48 such as a proximity switch are mounted on the front wall 25b of the carriage 25 so as to control the upward movement and downward movement respectively of the short circuit detectors 10. A detected element 49 is fixed to one of the internally threaded cylindrical members 36 so that the upward movement and downward movement thereof can be detected by the respective position detectors 47 and 48 and the rotation of the lifting and lowering motor 41 can be stopped at the upper limit and lower limit of the vertical movement of the short-circuit detectors 10.

The operation of the device of the present invention will be described in detail with reference to a control circuit shown in FIGS. 3 and 4.

Figure 3:
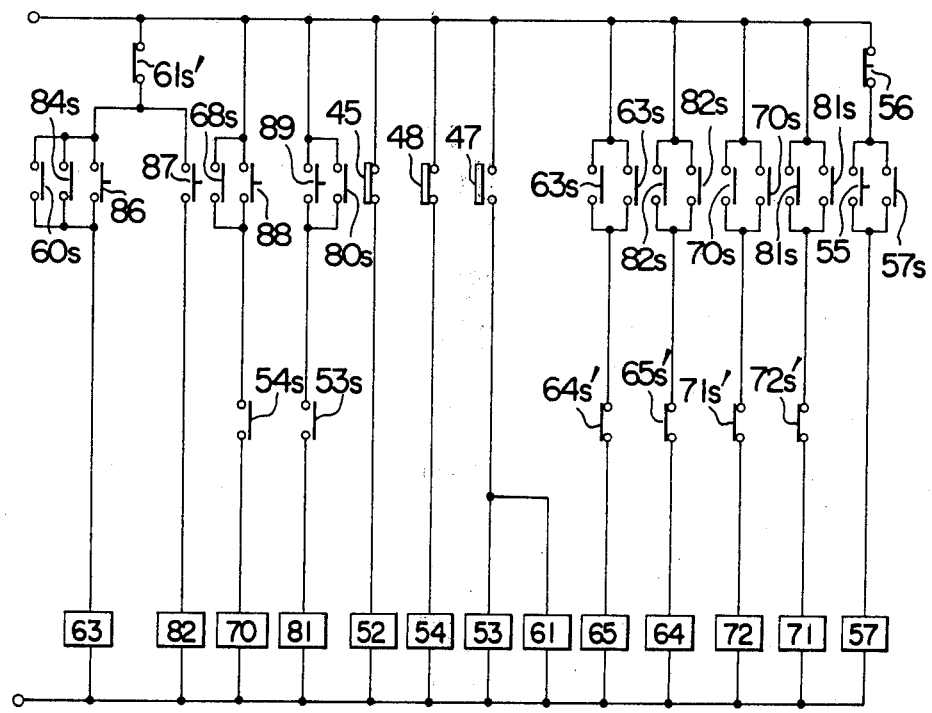
FIGS. 3 and 4 show one form of a control circuit employed in the present invention.

The control circuit portion shown in FIG. 3 includes a carriage travelling movement restriction relay 52, a short-circuit detector downward movement restriction relay 53, a short-circuit detector upward movement restriction relay 54, an automatic control relay 57, a drive motor stopping relay 61 energized for stopping the operation of the drive motor 26 during the upward movement of the short-circuit detectors 10, an auxiliary relay 63 energized when the travelling movement of the carriage 25 in one direction is started with the drive motor 26 rotating in the normal direction, an electromagnetic switch 64 turned on when the drive motor 26 is rotated in the reverse direction, another electromagnetic switch 65 turned on when the drive motor 26 is rotated in the normal direction, another auxiliary relay 70 energized during the downward movement of the short-circuit detectors 10, another electromagnetic switch 71 turned on when the lifting and lowering motor 41 is rotated in the lifting direction, another electromagnetic switch 72 turned on when the lifting and lowering motor 41 is rotated in the lowering direction, another auxiliary relay 81 energized during the upward movement of the short-circuit detectors 10, and another auxiliary relay 82 energized when the travelling movement of the carriage 25 in the other direction is started with the drive motor 26 rotating in the reverse direction. The control circuit portion shown in FIG. 3 further includes a starting push button switch 55 and a stopping push button switch 56 which are turned off and on respectively in response to the depression.

Figure 4:
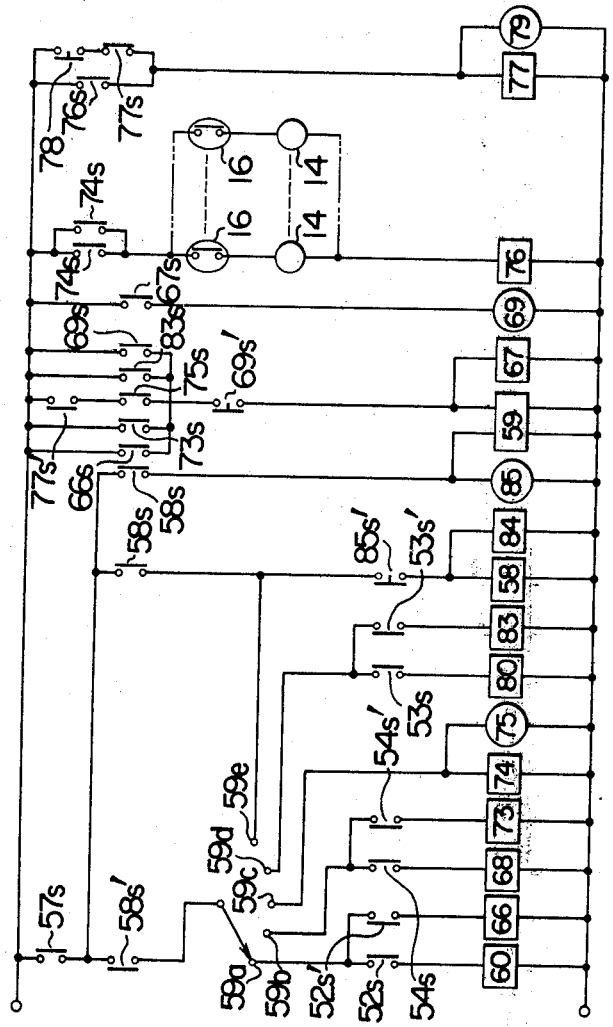

The control circuit portion shown in FIG. 4 includes a carriage travelling movement restriction release relay 58, a stepping relay 59, a carriage travelling movement instruction relay 60, a step feed instruction relay 66 for the stepping relay 59, a step feed time setting relay 67, a short-circuit detector downward movement instruction relay 68, a timer 69 for setting the length of time required for the step feed, another step feed instruction relay 73 for the stepping relay 59, a current measurement instruction relay 74, another timer 75 for setting the length of time required for current measurement, a short-circuit detection relay 76, an alarm relay 77, a confirmation push button switch 78, an alarm lamp 79, a short-circuit detector upward movement instruction relay 80, another step feed instruction relay 83 for the stepping relay 59, another carriage travelling movement instruction relay 84, and another timer 85 for setting the length of time required for moving the position detector 45 away from the position opposed by one of the detected elements 46.

Further, in FIG. 3, push button switches 86 and 87 are provided to manually start the travelling movement of the carriage 25 in the respective moving directions, and push button switches 88 and 89 are provided to manually cause the upward movement and downward movement respectively of the short-circuit detectors 10.

Suppose that the carriage 25 is situated above the electrolytic cell 1 with the short-circuit detectors 10 held in the upper or retracted position, and the carriage travelling position detector 45 is not opposed by anyone of the detected elements 46. In such a state, the carriage travelling position detector 45 is in the deenergized state with its contact turned on, and the short-circuit detector upper position detector 47 is in the energized state with its contact turned off, while the short-circuit detector lower position detector 48 is in the deenergized state with its contact turned on in FIG. 3. In this state, the carriage travelling movement restriction relay 52 and short-circuit detector downward movement restriction relay 54 are in the energized state, and the short-circuit circuit detector upward movement restriction relay 53 is in the deenergized state in FIG. 3. The stopping push button switch 56 is in the on position in FIG. 3. In response to the depression of the starting push button switch 55 to turn on the same, the automatic control relay 57 is energized in FIG. 3 via these switches 56 and 55, and a make contact 57s of this relay 57 is turned on so that the relay 57 holds itself over this make contact 57s. Since the relay 57 holds itself, another make contact 57s thereof is turned on in FIG. 4. A make contact 52s of the carriage travelling movement restriction relay 52 is turned on in FIG. 4 since the relay 52 is in the energized state. Therefore, the carriage travelling movement instruction relay 60 is energized in FIG. 4 via a break contact 58s' of the carriage travelling movement restriction release relay 58, a first stationary contact 59a of the stepping relay 59 and the make contact 52s of the relay 52. In response to the energization of the relay 60, the auxiliary relay 63 is energized in FIG. 3 via a break contact 61s' of the drive motor stopping relay 61 and a make contact 60s of the relay 60. In response to the energization of the relay 63, a make contact 63s thereof is turned on in FIG. 3 to turn on the electromagnetic switch 65 via a break contact 64s' of the electromagnetic switch 64. The drive motor 26 starts to rotate in the normal direction, and the carriage 25 starts to travel toward the end of the electrolytic cell 2.

When the carriage travelling position detector 45 is brought to the position directly above the detected element 46 disposed at this end of the electrolytic cell 2, the position detector 45 is deenergized to deenergize the carriage travelling movement restriction relay 52 in FIG. 3, and the carriage travelling movement instruction relay 60 is also deenergized in FIG. 4. The drive motor 26 ceases to rotate to stop the travelling movement of the carriage 25. In response to the deenergization of the relay 52, the step feed instruction relay 66 for the stepping relay 59 is energized in FIG. 4 via a break contact 52s' of the relay 52. A make contact 66s of the relay 66 is turned on to energize the step feed time setting relay 67 and stepping relay 59 in FIG. 4. The relay 67 holds itself over a make contact 67s thereof to maintain the relay 59 in the energized state for a sufficient length of time. In response to the energization of the stepping relay 59, the movable contact thereof engages now with a second stationary contact 59b. Therefore, the short-circuit detector downward movement instruction relay 68 is energized via a make contact 54s which is turned on due to the energization of the relay 54. In the meantime, the timer 69 for setting the length of time required for the step feed is energized in FIG. 4 via a make contact 67s of the relay 67 which is in the energized state, and a break contact 69s' of the timer 69 is turned off to deenergize the relays 59 and 67 upon lapse of the time setting.

In response to the energization of the short-circuit detector downward movement instruction relay 68, the auxiliary relay 70 is energized in FIG. 3 via a make contact 68s of the relay 68 and a make contact 54s of the short-circuit detector downward movement restriction relay 54. In response to the energization of the relay 70, the electromagnetic switch 72 is turned on in FIG. 3 via a break contact 71s' of the electromagnetic switch 71. The short-circuit detector lifting and lowering motor 41 starts to rotate in the lowering direction to cause downward movement of the short-circuit detectors 10 carried by the supporter 11. When the short-circuit detectors 10 are urged downward to the position at which they can be come in contact with the cathodes 7 in the electrolytic cell 2, the short-circuit detector lower position detector 48 is energized to turn off the contact thereof thereby deenergizing the short-circuit detector downward movement restriction relay 54 in FIG. 3. As a result, the short-circuit detector downward movement instruction relay 68 is also deenergized in FIG. 4 to cease the downward movement of the short-circuit detectors 10. The step feed instruction relay 73 is energized in FIG. 4 via a break contact 54s' of the relay 54 in response to the deenergization of the relay 68, and the stepping relay 59 is energized again. The movable contact of the stepping relay 59 engages now with a third stationary contact 59c with the result that the current measurement instruction relay 74 and the timer 75 for setting the length of time of current measurement start to operate in FIG. 4.

In response to the energization of the relay 74, the power supply voltage is applied to the reed switch 16 in each short-circuit detector 10 via a make contact 74s of the relay 74 in FIG. 4. When anyone of these reed switches 16 is turned on due to the occurrence of short-circuit between the associated anode and cathode, the corresponding display lamp 14 is energized and the short-circuit detection relay 76 is energized in FIG. 4. The alarm relay 77 is energized in FIG. 4 via a make contact 76s of the relay 76, and a make contact 77s of the relay 77 is turned on. The relay 77 holds itself over the make contact 77s thereof and the normally-closed contact of the confirmation push button switch 78, and the alarm lamp 79 is energized in FIG. 4. A break contact 77s' of the relay 77 is turned off in response to the energization of the relay 77. As a result, the stepping relay 59 and step feed time setting relay 67 are deenergized in FIG. 4, and the contact change-over in the stepping relay 59 is stopped.

When the operator confirms the position of the short-circuit and then depresses the confirmation push button switch 78 to turn off the contact thereof, the alarm relay 77 is deenergized and the alarm lamp 79 is also deenergized in FIG. 4. In response to the deenergization of this relay 77, the stepping relay 59 is energized again in FIG. 4 via the break contact 77s' of the relay 77, a make contact 75s of the measuring time setting timer 75 turned on due to the lapse of the time setting, and a break contact 69s' of the step feed time setting relay 69. The movable contact of the stepping relay 59 engages now with a fourth stationary contact 59d. The contact of the short-circuit detector upper position detector 47 is turned on in FIG. 3 since the short-circuit detectors 10 are in their lower position. The short-circuit detector upward movement restricton relay 53 and drive motor stopping relay 61 are energized in FIG. 3, and their make contacts and break contacts are turned on and off respectively. Therefore, the short-circuit detector upward movement instruction relay 80 is energized in FIG. 4 via the stationary contact 59d of the relay 59 and a make contact 53s of the relay 53, and the auxiliary relay 81 is energized in FIG. 3 via a make contact 80s of the relay 80 and a make contact 53s of the relay 53. In response to the energization of this relay 81, the electromagnetic switch 71 is turned on in FIG. 3 via a make contact 81s of the relay 81 and a break contact 72s' of the electromagnetic switch 72. The lifting and lowering motor 41 is rotated in the lifting direction to cause upward movement of the supporter 11, hence the short-circuit detectors 10, in response to the turn-on of the electromagnetic switch 71.

At the upper limit of the upward movement of the short-circuit detectors 10, the short-circuit detector upper position detector 47 is energized by detecting the detected element 49, and the contact of the detector 47 is turned off. As a result, the short-circuit detector upward movement restriction relay 53 and drive motor stopping relay 61 are deenergized in FIG. 3 to cease the upward movement of the short-circuit detectors 10. Until the short-circuit detectors 10 reach the upper limit thereof, the drive motor stopping relay 61 is kept in the energized state with its break contact 61s' turned off. Thus, the auxiliary relays 63 and 82 associated with the travelling movement of the carriage 25 in the normal and reverse directions respectively are kept in the deenergized state in FIG. 3 to prevent the drive motor 26 from rotating in either direction. In response to the operation of the short-circuit detector upper position detector 47, the short-circuit detector upward movement restriction relay 53 and drive motor stopping relay 61 are deenergized in FIG. 3 to cease the upward movement of the short-circuit detectors 10. At the same time, the step feed instruction relay 83 is energized in FIG. 4 via the stationary contact 59d of the stepping relay 59 and a break contact 53s' of the relay 53 to turn on a make contact 83s thereof. As a result, the stepping relay 59 is energized, and the movable contact thereof energizes now with a fifth stationary contact 59e. Therefore, the carriage travelling movement restriction release relay 58 and carriage travelling movement instruction relay 84 are energized in FIG. 4. A make contact 58s of the relay 58 is turned on, and these relays 58 and 84 hold themselves over this make contact 58s and a break contact 58s' of the moving time setting timer 85. The stepping relay 59 is reset in FIG. 4 in response to the energization of the relay 58, and the movable contact thereof is moved to engage now with the first stationary contact 59a. Further, the energization of the relay 58 energizes the moving time setting timer 85 in FIG. 4 which sets the length of time required for moving the carriage travelling position detector 45 away from the detected element 46. Thus, the drive motor 26 is rotated again and continues to rotate until the break contact 85s' of the relay 85 is turned off upon lapse of the time setting. The carriage 25 starts to travel and continues to travel by being driven by the drive motor 26 due to the fact that the carriage travelling movement instruction relay 60 is energized again upon lapse of the time setting above described. The carriage 25 ceases its travelling movement when the carriage travelling position detector 45 is brought to the position directly above the detected element 46 at one end of the electrolytic cell 3, and operation as described above is then repeated.

It will be understood from the foregoing detailed description that the electrode short-circuit detecting device according to the present invention comprises a carriage capable of making travelling movement over a plurality of electrolytic cells, a plurality of short-circuit detectors each including a display lamp therein and carried vertically movably by the carriage at a position corresponding to the current collecting end portions of the cathodes in the electrolytic cells. Thus, when short-circuit occurs between anyone of the cathodes and the associated anode, the display lamp in the corresponding short-circuit detector is lit to give visual indication of the shorting electrodes. Further, failure to detect the shorting electrodes can be avoided due to the fact that the display lamp corresponding to the detected shorting position is kept in the lit state. The carriage is automatically moved to the next electrolytic cell when no short-circuit is detected in one of the electrolytic cells. Thus, the time requied for short-circuit detection can be reduced. A recorder having recording pens corresponding to the individual switch elements may be provided so that occurrence of short-circuit on the electrodes can be automatically recorded and the record can be subsequently reviewed to assist in the management of the electrolysis operation.

What is claimed is:

1. A device for detecting short-circuit occurring between anodes and cathodes in electrolytic cells constituting an electrolytic plant, comprising a plurality of switch elements turned on and off under control of an external magnetic field, display means responsive to the operation of said switch elements, means for supporting said switch elements at a position above the current collecting end portions of the individual anodes or cathodes in one of said electrolytic cells, and means for carrying said switch element supporting means for vertical movement and capable of making travelling movement over said electrolytic cells from the position associated with one of said electrolytic cells to the position associated with the adjacent one, the travelling movement of said carrying means controlled so that said switch elements can be accurately brought to the position adjacent to the current collecting end portions of the associated anodes or cathodes in each said electrolytic cell.

2. A short-circuit detecting device as claimed in claim 1, further comprising vertical movement control means for controlling the upward movement of said switch element supporting means during the travelling movement of said carrying means and for controlling the downward movement of said switch element supporting means when said carrying means ceases the travelling movement thereof and is held stationary.

3. A short-circuit detecting device as claimed in claim 2, wherein said vertical movement control means controls the vertical movement of said switch element supporting means so that said switch element supporting means can be moved upward automatically from the lower position upon lapse of a predetermined period of time when no short-circuit is detected on said electrodes, and said switch element supporting means can be maintained in the lower position when short-circuit is detected on anyone of said electrodes.

4. A short-circuit detecting device as claimed in claim 1, further comprising travelling movement control means which controls said carrying means so that said carrying means can be moved automatically from the position associated with one of said electrolytic cells to the position associated with the next one of said electrolytic cells when no short-circuit is detected on said electrodes in the former electrolytic cell.

5. A short-circuit detecting device as claimed in claim 2, further comprising travelling movement control means which controls said carrying means so that said carrying means can be moved automatically from the position associated with one of said electrolytic cells to the position associated with the next one of said electrolytic cells when no short-circuit is detected on said electrodes in the former electrolytic cell.

6. A short-circuit detecting device as claimed in claim 5, wherein said vertical movement control means comprises upper position detecting means for detecting the upward movement of said switch element supporting means so that, in response to the operation of said upper position detecting means, said travelling movement control means can be actuated to start the automatic travelling movement of said carrying means toward said next electrolytic cell.

7. A short-circuit detecting device as claimed in claim 1, wherein each of said switch elements comprises a reed switch turned on by said external magnetic field, a permanent magnet for applying a magnetic field in a direction opposite to the direction of application of said external magnetic field, and means for adjusting the position of said reed switch relative to that of said permanent magnet for setting the operation range of said reed switch.

8. A short-circuit detecting device as claimed in claim 1, wherein said carrying means comprises a carriage bridging across the row of said electrolytic cells and movable over said electrolytic cell row along a pair of guide members extending in the longitudinal direction of said electrolytic cell row on opposite sides thereof, and said carriage is provided with a drive source for causing the travelling movement of said carriage by driving a plurality of wheels engaging with said guide members, and a travelling position detector for deenergizing said drive source in response to the detection of anyone of a plurality of detected elements disposed in spaced apart relation in the extending direction of said guide members.

9. A short-circuit detecting device as claimed in claim 2, wherein said vertical movement control means comprises a drive source mounted on said carrying means, a power transmission mechanism operatively connecting said drive source to said switch element supporting means for causing the vertical movement of said switch element supporting means, an upper position detector mounted on said carrying means, and a detected element mounted on said switch element supporting means for actuating said upper position detector, said upper position detector being operative to control the travelling movement of said carrying means and to control said drive source when the travelling movement of said carrying means is ceased.

10. A short-circuit detecting device as claimed in claim 3, wherein said vertical movement control means comprises a drive source mounted on said carrying means, a lower position detector mounted on said carrying means, a detected element mounted on said switch element supporting means to be detected by said lower position detector when said switch elements are lowered to the position adjacent to the current collecting end portions of said electrodes, a first circuit energized in response to the detection of said detected element by said lower position detector for causing the upward movement of said switch element supporting means upon lapse of a predetermined period of time after the detection, and a second circuit for deenergizing said first circuit in response to the operation of said display means.

11. A short-circuit detecting device as claimed in claim 10, further comprising switch means for manually turning off said second circuit.

* * * * *